United States Patent
Sakakura (10) Patent No.: US 10,067,202 B2
(45) Date of Patent: Sep. 4, 2018

(54) MAGNETIC RESONANCE IMAGING APPARATUS AND GRADIENT COIL

(71) Applicant: TOSHIBA MEDICAL SYSTEMS CORPORATION, Otawara-shi (JP)

(72) Inventor: Yoshitomo Sakakura, Tochigi (JP)

(73) Assignee: TOSHIBA MEDICAL SYSTEMS CORPORATION, Otawara-Shi, Tochigi-Ken (JP)

(*) Notice: Subject to any disclaimer, the term of this patent is extended or adjusted under 35 U.S.C. 154(b) by 396 days.

(21) Appl. No.: 14/841,090

(22) Filed: Aug. 31, 2015

(65) Prior Publication Data

US 2015/0369884 A1 Dec. 24, 2015

(30) Foreign Application Priority Data

Mar. 1, 2013 (JP) ................................. 2013-040895

(51) Int. Cl.
  *G01R 33/34* (2006.01)
  *G01R 33/385* (2006.01)
  *G01R 33/421* (2006.01)

(52) U.S. Cl.
  CPC ..... *G01R 33/3403* (2013.01); *G01R 33/3856* (2013.01); *G01R 33/3858* (2013.01); *G01R 33/4215* (2013.01)

(58) Field of Classification Search
  CPC .................................. A61B 2090/374; A61B 2090/3954–2090/3958;

(Continued)

(56) References Cited

U.S. PATENT DOCUMENTS

| 5,349,744 A | 9/1994 | Takahashi |
| 6,882,153 B2 * | 4/2005 | Vavrek ................ G01R 33/385 324/322 |

(Continued)

FOREIGN PATENT DOCUMENTS

| CN | 101852842 A | 10/2010 |
| JP | 4-337614 A | 11/1992 |

(Continued)

OTHER PUBLICATIONS

Chinese office action dated Jun. 26, 2017, in Patent Application No. CN 201480011598.2.

(Continued)

*Primary Examiner* — Melissa Koval
*Assistant Examiner* — Rahul Maini
(74) *Attorney, Agent, or Firm* — Nixon & Vanderhye P.C.

(57) ABSTRACT

A magnetic resonance imaging apparatus includes a static magnetic field magnet and a gradient coil. The static magnetic field magnet generates a static magnetic field. The gradient coil is provided on an inside of the static magnetic field magnet and includes an X coil, a Y coil and a Z coil. The X coil generates a gradient magnetic field along a horizontal axis of a substantially circular cylinder, the horizontal axis being perpendicular to a long axis. The Y coil generates a gradient magnetic field along a vertical axis of the substantially circular cylinder. The Z coil generates a gradient magnetic field along the long axis of the substantially circular cylinder. In the gradient coil, coils are laminated in such a manner that the X coil is positioned more distant from a magnetic field center than the Y coil is.

7 Claims, 6 Drawing Sheets

(58) Field of Classification Search
CPC ........ A61B 5/055–5/0555; G06T 2207/10088; G01R 33/20–33/64
USPC ............ 324/300–322; 600/407–436; 424/9.3
See application file for complete search history.

(56) References Cited

U.S. PATENT DOCUMENTS

| | | | |
|---|---|---|---|
| 7,372,265 B2 * | 5/2008 | Ham | G01R 33/3854 324/318 |
| 8,063,638 B2 | 11/2011 | Seeber | |
| 2004/0075434 A1 | 4/2004 | Vavrek et al. | |
| 2004/0189298 A1 | 9/2004 | Vavrek et al. | |
| 2007/0268021 A1 * | 11/2007 | Sakakura | G01R 33/3858 324/322 |
| 2010/0085053 A1 * | 4/2010 | Iwasa | G01R 33/3856 324/318 |
| 2011/0074419 A1 | 3/2011 | Sakakura | |

FOREIGN PATENT DOCUMENTS

| | | |
|---|---|---|
| JP | 4-367650 A | 12/1992 |
| JP | 6-269422 A | 9/1994 |
| JP | 2004-136092 A | 5/2004 |
| JP | 2011-010760 A | 1/2011 |
| JP | 2011-087904 A | 5/2011 |

OTHER PUBLICATIONS

Chinese office action dated Jan. 19, 2018, in Patent Application No. CN 201480011598.2.
Japanese office action dated Jul. 17, 2018, in Patent Application No. JP 2014-040957.

* cited by examiner

MAGNETIC RESONANCE IMAGING APPARATUS AND GRADIENT COIL

CROSS-REFERENCE TO RELATED APPLICATIONS

This application is a continuation of PCT international application Ser. No. PCT/JP2014/055324 filed on Mar. 3, 2014 which designates the United States, incorporated herein by reference, and which claims the benefit of priority from Japanese Patent Application No. 2013-040895, filed on Mar. 1, 2013, the entire contents of which are incorporated herein by reference.

FIELD

Embodiments described herein relate generally to a magnetic resonance imaging apparatus and a gradient coil.

BACKGROUND

Magnetic resonance imaging is an image taking method by which nuclear spins in an examined subject placed in a static magnetic field are magnetically excited by a radio frequency (RF) pulse having a Larmor frequency thereof so as to generate an image from data of magnetic resonance signals generated due to the excitation. A magnetic resonance imaging apparatus includes a gradient coil provided on an inside of a static magnetic field magnet. Further, in the gradient coil, an X coil that generates a gradient magnetic field along the horizontal axis of a substantially circular cylinder (the horizontal axis is perpendicular to a long axis of the substantially circular cylinder), a Y coil that generates a gradient magnetic field along a vertical axis of the substantially circular cylinder, and a Z coil that generates a gradient magnetic field along the long axis of the substantially circular cylinder are laminated together.

In recent years, high-speed image taking processes such as an Echo Planar Imaging (EPI) process are becoming popular. When performing high-speed image taking processes, because an electric current having a high power duty is applied to the X coil, the X coil generates heat most easily. Also, conventionally, the X coil has been laminated in the innermost position closest to the space formed on the inside of the substantially circular cylinder, which is the space in which a subject is placed. Although the gradient coil is provided with a cooling pipe for causing a cooling medium such as water to circulate, if the X coil is not sufficiently cooled, the comfortability of the subject is degraded. In some situations, there is a possibility that the image taking process may need to be stopped in compliance with a standard defined by the International Electrotechnical Commission (IEC).

DETAILED DESCRIPTION

A magnetic resonance imaging apparatus according to an embodiment includes a static magnetic field magnet and a gradient coil. The static magnetic field magnet generates a static magnetic field. The gradient coil is provided on an inside of the static magnetic field magnet and includes an X coil, a Y coil and a Z coil. The X coil generates a gradient magnetic field along a horizontal axis of a substantially circular cylinder, the horizontal axis being perpendicular to a long axis of the substantially circular cylinder. The Y coil generates a gradient magnetic field along a vertical axis of the substantially circular cylinder. The Z coil generates a gradient magnetic field along the long axis of the substantially circular cylinder. In the gradient coil, coils are laminated in such a manner that the X coil is positioned more distant from a magnetic field center than the Y coil is.

Exemplary embodiments of a Magnetic Resonance Imaging apparatus (hereinafter, "MRI apparatus", as appropriate) and a gradient coil will be explained below, with reference to the accompanying drawings. Possible embodiments are not limited to the embodiments described below. Further, the contents of the explanations in each of the embodiments are, in principle, similarly applicable to any other embodiment.

First Embodiment

Figure 1:
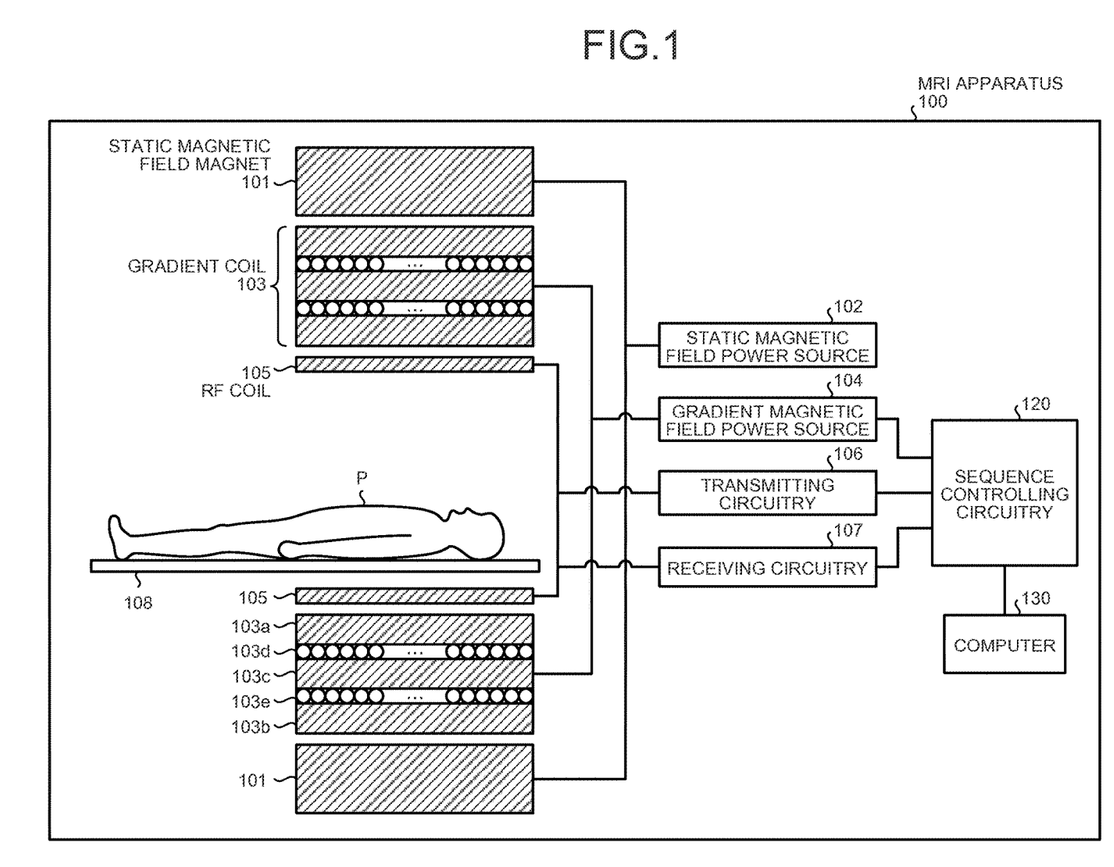
FIG. 1 is a block diagram of a Magnetic Resonance Imaging (MRI) apparatus according to a first embodiment.

FIG. 1 is a block diagram of an MRI apparatus 100 according to a first embodiment. As illustrated in FIG. 1, the MRI apparatus 100 includes a static magnetic field magnet 101, a static magnetic field power source 102, a gradient coil 103, a gradient power source 104, a Radio Frequency (RF) coil 105, transmitting circuitry 106, receiving circuitry 107, a couch 108, sequence controlling circuitry 120, and a computer 130. The MRI apparatus 100 does not include an examined subject (hereinafter, "subject") P, (which is a human body, for example). Further, the configuration illustrated in FIG. 1 is merely an example. Any of the constituent elements may be integrated together or configured separately, as appropriate.

The static magnetic field magnet 101 is a magnet formed substantially in the shape of a hollow circular (or oval) cylinder and generates a static magnetic field in the space formed on the inside of the substantially circular cylinder. The static magnetic field magnet 101 may be configured by using, for example, a superconductive magnet and is magnetically excited by receiving a supply of electric current from the static magnetic field power source 102. The static magnetic field power source 102 supplies the electric current to the static magnetic field magnet 101. Alternatively, the static magnetic field magnet 101 may be configured by using a permanent magnet. In that situation, the MRI apparatus 100 does not necessarily have to include the static magnetic field power source 102. Further, the static magnetic field power source 102 may be provided separately from the MRI apparatus 100.

The gradient coil 103 is a coil that is provided on the inside of the static magnetic field magnet 101 and is formed substantially in the shape of a hollow circular cylinder. The gradient coil 103 generates a gradient magnetic field by receiving a supply of electric current from the gradient power source 104. The gradient coil 103 will be explained in detail later. The gradient power source 104 supplies the electric current to the gradient coil 103.

The RF coil 105 is provided on the inside of the gradient coil 103 and generates a radio frequency magnetic field by receiving a supply of an RF pulse from the transmitting circuitry 106. Further, the RF coil 105 receives magnetic resonance signals (hereinafter, "MR signals", as appropriate) emitted from the subject P due to an influence of the radio frequency magnetic field and to output the received MR signals to the receiving circuitry 107.

The RF coil 105 described above is merely an example. The RF coil 105 may be configured by using any one of the following or combining any of the following: a coil having only a transmitting function; a coil having only a receiving function; and a coil having transmitting and receiving functions.

The transmitting circuitry 106 supplies the RF pulse corresponding to a Larmor frequency determined by the type of targeted atoms and the magnetic field intensities, to the RF coil 105. The receiving circuitry 107 detects the MR signals output from the RF coil 105 and to generate MR data on the basis of the detected MR signals. More specifically, the receiving circuitry 107 generates the MR data by applying a digital conversion of the MR signals output from the RF coil 105. Also, the receiving circuitry 107 sends the generated MR data to the sequence controlling circuitry 120. The receiving circuitry 107 may be provided on a gantry device side where the static magnetic field magnet 101, the gradient coil 103, and the like are provided.

The couch 108 includes a couchtop on which the subject P is placed. In FIG. 1, for the convenience in the explanation, only the couchtop is illustrated. Normally, the couch 108 is provided so that the longitudinal direction thereof extends parallel to the central axis of the substantially circular cylinder of the static magnetic field magnet 101. Further, the couchtop is movable in longitudinal directions and up-and-down directions. While the subject P is placed thereon, the couchtop is inserted into the space formed on the inside of the substantially circular cylinder inside the RF coil 105. The space formed on the inside of the substantially circular cylinder may be referred to as a "bore", or the like.

The sequence controlling circuitry 120 performs an image taking process on the subject P, by driving the gradient power source 104, the transmitting circuitry 106, and the receiving circuitry 107, on the basis of sequence information transmitted from the computer 130. In this situation, the sequence information is information that defines a procedure for performing the image taking process. The sequence information defines: the intensity of the electric current to be supplied by the gradient power source 104 to the gradient coil 103 and the timing with which the electric current is to be supplied; the intensity of the RF pulse to be supplied by the transmitting circuitry 106 to the RF coil 105 and the timing with which the RF pulse is to be applied; the timing with which the MR signals are to be detected by the receiving circuitry 107, and the like. For example, the sequence controlling circuitry 120 performs a high-speed image taking process such as an EPI process. Further, for example, when acquiring an axial cross-sectional image of the subject P by performing a high-speed image taking process, the sequence controlling circuitry 120 sets the left-and-right direction of the subject P as a Read Out (RO) direction and the back-and-front direction of the subject P as a Phase Encoding (PE) direction. In that situation, an electric current having a high power duty is applied to the X coil. In this situation, the power duty is calculated as the square of an average current value supplied to the gradient coil 103 and is expressed with a percentage value of which the largest possible value is 100(%).

For example, the sequence controlling circuitry 120 may be configured by using an integrated circuit such as an Application Specific Integrated Circuit (ASIC) or a Field Programmable Gate Array (FPGA) or an electronic circuit such as a Central Processing Unit (CPU) or a Micro Processing Unit (MPU).

When having received the MR data from the receiving circuitry 107 as a result of taking the image of the subject P by driving the gradient power source 104, the transmitting circuitry 106, and the receiving circuitry 107, the sequence controlling circuitry 120 transfers the received MR data to the computer 130.

The computer 130 exercises overall control of the MRI apparatus 100. Further, the computer 130 generates an MR image or the like by performing a reconstructing process such as a Fourier transform on the MR data transferred thereto from the sequence controlling circuitry 120. For example, the computer 130 includes a controlling circuitry, storage, an input unit, and a display. The controlling circuitry may be an integrated circuit such as an ASIC or an FPGA or may be an electronic circuit such as a CPU or an MPU. The storage may be a semiconductor memory device such as a Random Access Memory (RAM) or a flash memory or may be a hard disk, an optical disk, or the like. The input unit is a pointing device such as a mouse or a trackball, a selecting device such as a mode changing switch, or an input device such as a keyboard. The display is a display device such as a liquid crystal display monitor.

Figure 2:
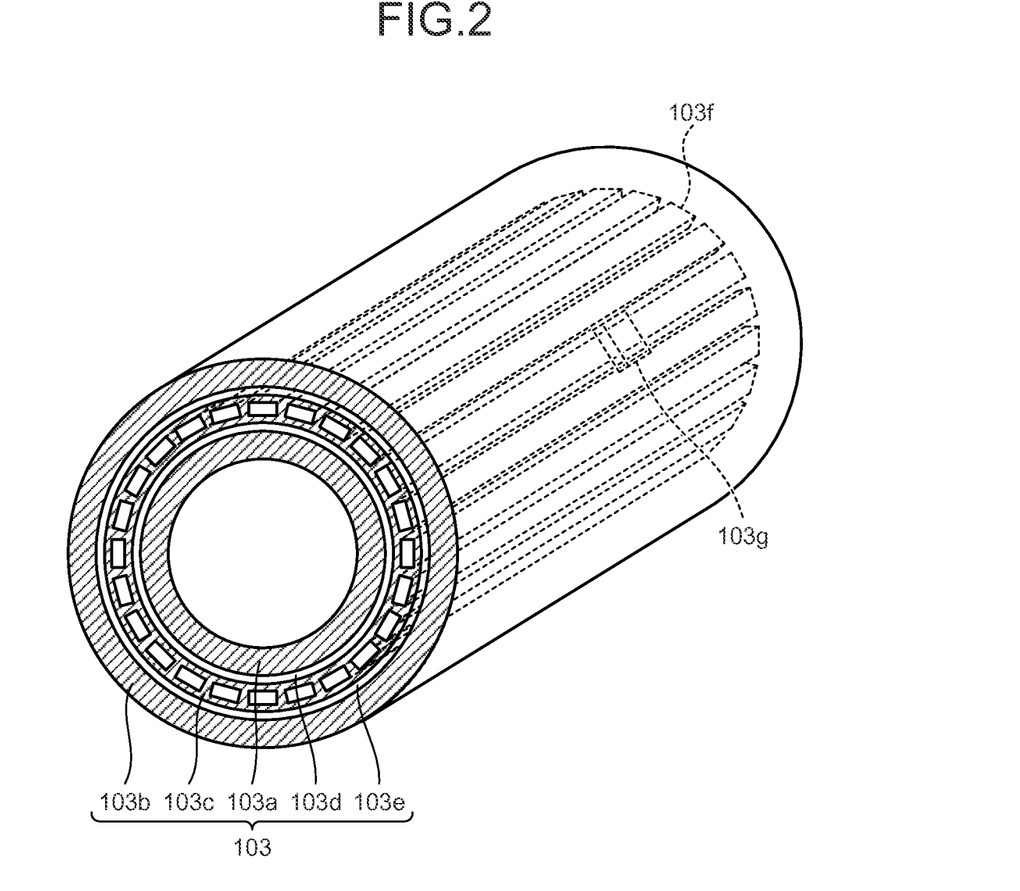
FIG. 2 is a perspective view illustrating a structure of a gradient coil according to the first embodiment.

FIG. 2 is a perspective view illustrating a structure of the gradient coil 103 according to the first embodiment. In the first embodiment, the gradient coil 103 is an Actively Shielded Gradient Coil (ASGC) and includes a main coil 103a that generates gradient magnetic fields and a shield coil 103b that generates a shielding-purpose magnetic field that cancels out leakage magnetic field. As illustrated in FIG. 2, in the gradient coil 103, the main coil 103a, a cooling layer 103d in which a cooling pipe is disposed, a shim layer 103c in which shim trays are disposed, a cooling layer 103e in which another cooling pipe is disposed, and the shield coil 103b are laminated together in the stated order, starting from the interior positioned closer to the space formed on the inside of the substantially circular cylinder.

In the shim layer 103c, shim tray insertion guides 103f for a plurality of (e.g., twenty-four) shim trays are formed. Typically, the shim tray insertion guides 103f are holes that extend through the gradient coil 103 along the whole length in the long-axis direction thereof and that are formed at equal intervals in the circumferential direction, as illustrated in FIG. 2. Each of the shim trays (not illustrated) to be inserted in the shim tray insertion guides 103f has, for example, a plurality of (e.g., fifteen) pockets arranged in the longitudinal direction. For the purpose of correcting non-uniformity of the static magnetic fields, a predetermined number of iron shims are stored in predetermined one or more of the pockets.

Typically, in each of the cooling layers 103d and 103e, a cooling pipe is helically disposed along the shape of the substantially circular cylinder (not illustrated in FIG. 2). Although not illustrated in FIG. 1, the MRI apparatus 100 according to the first embodiment is further provided with a cooling device that includes a heat exchanger and a circulation pump. The cooling device cools the gradient coil 103 by causing a cooling medium such as water to circulate through the cooling pipes. As explained above, the cooling system of the MRI apparatus 100 is provided in an intermediate layer of the gradient coil 103 in such a manner that the iron shims are interposed therebetween.

Figure 3:
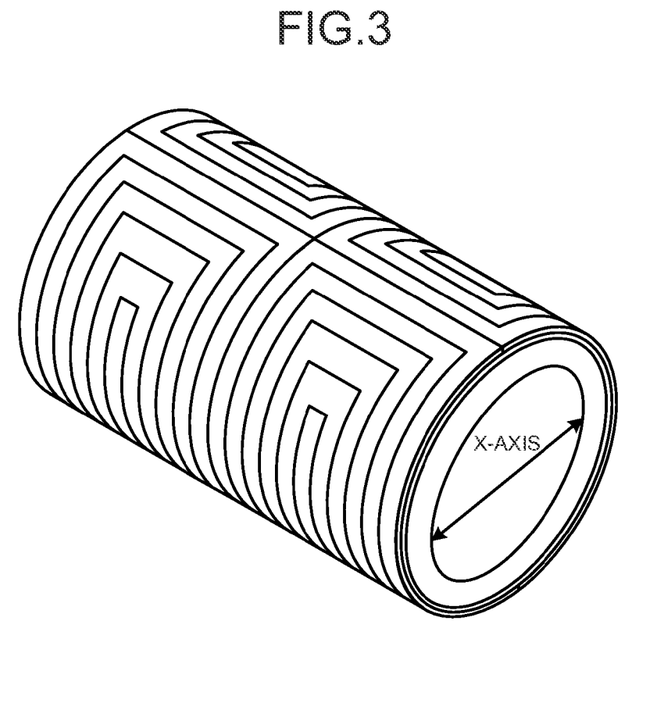
FIG. 3 is a drawing for explaining an X coil according to the first embodiment.
Figure 4:
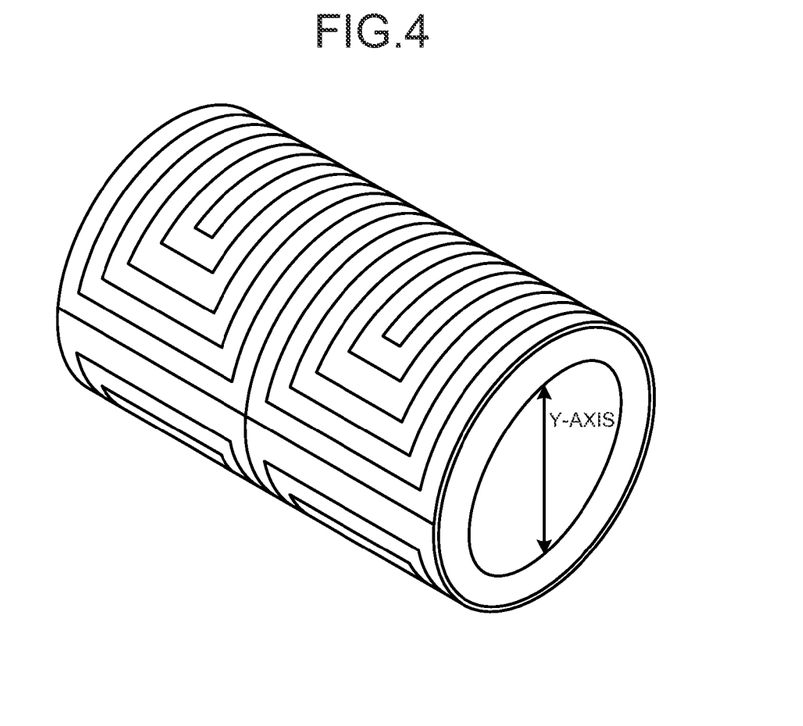
FIG. 4 is a drawing for explaining a Y coil according to the first embodiment.
Figure 5:
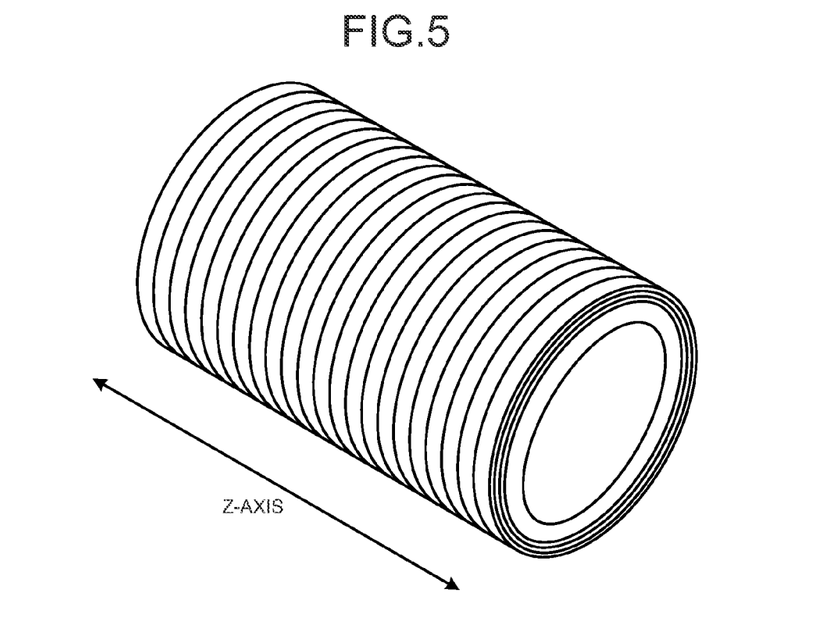
FIG. 5 is a drawing for explaining a Z coil according to the first embodiment.

Incidentally, the main coil 103a is formed by laminating together three coils corresponding to X-, Y-, and Z-axes that are orthogonal to one another, the three coils namely being an X coil, a Y coil, and a Z coil. FIG. 3 is a drawing for explaining the X coil according to the first embodiment. FIG. 4 is a drawing for explaining the Y coil according to the first embodiment. FIG. 5 is a drawing for explaining the Z coil according to the first embodiment.

As illustrated in FIG. 3, the X coil is a coil processed into a saddle shape and generates a gradient magnetic field along the X-axis, i.e., the horizontal axis of the substantially circular cylinder of the gradient coil 103. Further, as illustrated in FIG. 4, the Y coil is also a coil processed into a saddle shape similarly to the X coil, but generates a gradient magnetic field along the Y-axis, i.e., the vertical axis of the substantially circular cylinder of the gradient coil 103. Further, as illustrated in FIG. 5, the Z coil is a coil processed into a helical shape and generates a gradient magnetic field along the Z-axis, i.e., the long axis of the substantially circular cylinder of the gradient coil 103. The X coil, the Y coil, and the Z coil each individually receives a supply of electric current from the gradient power source 104 and generates the gradient magnetic fields of which the magnetic field intensities change along the X-, Y-, and Z-axes.

Although the drawing of the shield coil 103b is omitted, in a similar manner, the shield coil 103b is also formed by laminating together three coils corresponding to the X-, Y-, and Z-axes that are orthogonal to one another, the three coils namely being an X coil, a Y coil, and a Z coil.

Figure 6:
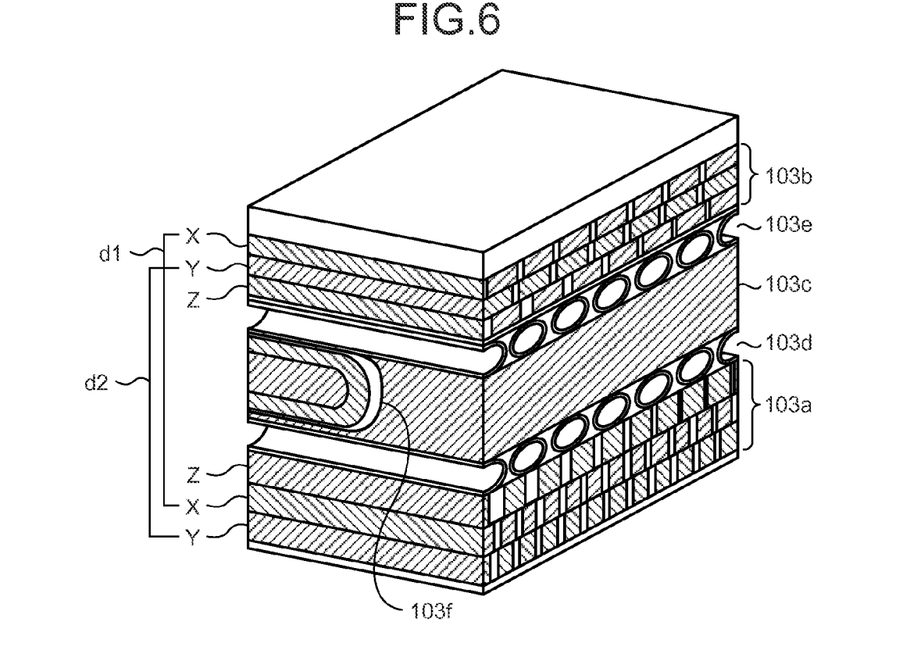
FIG. 6 is a drawing of laminated layers in the gradient coil according to the first embodiment.

FIG. 6 is a drawing of the laminated layers in the gradient coil 103 according to the first embodiment. FIG. 6 is a drawing of a rectangular parallelepiped 103g illustrated in FIG. 2 that is conceptually cut out. As illustrated in FIG. 6, the main coil 103a and the shield coil 103b each include the X coil (X), the Y coil (Y), and the Z coil (Z).

In the first embodiment, first of all, as illustrated in FIG. 6, the layers are laminated in the main coil 103a in the order of the Y coil, the X coil, and the Z coil, starting from a position closer to the space formed on the inside of the substantially circular cylinder. In other words, the coils are laminated together in such a manner that the X coil is positioned more distant from the space formed on the inside of the substantially circular cylinder (e.g., from the magnetic field center) than the Y coil is. To express the configuration differently, the coils are laminated together in such a manner that the X coil is positioned closer to the cooling pipe provided in the cooling layer 103d than the Y coil is.

The order in which the layers are laminated signifies roughly two aspects. First, one aspect is that, as mentioned above, because the X coil generates heat most easily, it is desirable to arrange the X coil to be laminated in a position as distant as possible from the space formed on the inside of the substantially circular cylinder, which is the space in which the subject P is placed. Secondly, the other aspect is that, as explained above, because the cooling pipe is disposed on the outside of the main coil 103a, it is desirable to arrange the X coil to be laminated in a position as close as possible to the cooling pipe. It is assumed that no cooling pipe is disposed on an inside of the main coil 103a. In other words, because no cooling pipe is disposed on the inside of the main coil 103a, it is desirable to laminate the coils in the order described above by which the X coil is positioned closer to the cooling pipe disposed on the outside of the main coil 103a.

Normally, the Z coils have an extremely higher efficiency in generating the gradient magnetic field than the X coils and the Y coils. For this reason, the Z coils are laminated so as to keep as small as possible the inter-layer distance between the Z coil included in the main coil 103a and the Z coil included in the shield coil 103b. In other words, the Z coil included in the main coil 103a is laminated in the outermost position, whereas the Z coil included in the shield coil 103b is laminated in the innermost position. When these positions of the Z coils are excluded from the options, while the two aspects mentioned above are taken into consideration, the X coil and the Y coil are laminated in the main coil 103a in the order of, as illustrated in FIG. 6, the Y coil and the X coil, starting from a position closer to the space formed on the inside of the substantially circular cylinder (e.g., the center of the magnetic field).

In contrast, the layers are laminated in the shield coil 103b in the order of, as illustrated in FIG. 6, the Z coil, the Y coil, and the X coil, starting from a position closer to the space formed on the inside of the substantially circular cylinder (e.g., the center of the magnetic field). The X coil is positioned more distant from the space formed on the inside of the substantially circular cylinder than the Y coil is. However, as for the positional relationships with the cooling pipe disposed in the cooling layer 103e, the Y coil is positioned closer to the cooling pipe than the X coil is.

The order in which the layers are laminated in the shield coil 103b is related to the efficiency in generating the gradient magnetic fields. In the gradient coil 103, it is desirable to balance, to some extent, the levels of efficiency in generating the gradient magnetic fields among the X coil, the Y coil, and the Z coil. In other words, it is not desirable to have a situation where a certain coil has a prominently high efficiency or, conversely, a prominently low efficiency in generating the gradient magnetic field. For this reason, in the first embodiment, the order in which the layers are laminated in the shield coil 103b is adjusted in order to arrange the characteristics of the X coils and the Y coils to match with each other and to maintain a balance in the levels of efficiency in generating the gradient magnetic fields.

More specifically, the layers are laminated in the shield coil 103b in the order of the Z coil, the Y coil, and the X coil, starting from a position closer to the space formed on the inside of the substantially circular cylinder. As a result, the order in which the layers are laminated is adjusted in such a manner that an inter-layer distance d1 between the X coil included in the main coil 103a and the X coil included in the shield coil 103b is substantially equal to an inter-layer distance d2 between the Y coil included in the main coil 103a and the Y coil included in the shield coil 103b.

Figure 7A:
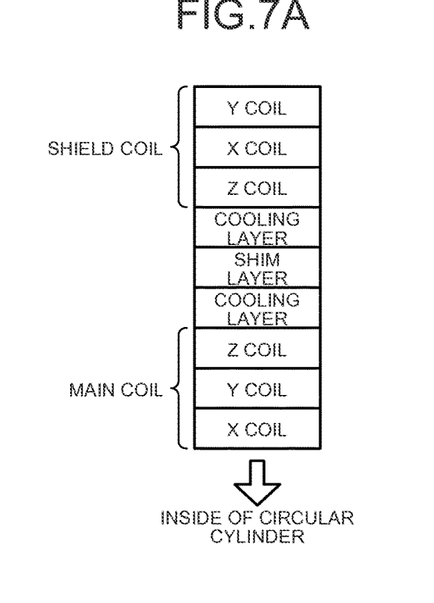
FIG. 7A and FIG. 7B are drawings illustrating an order in which the layers are laminated in the gradient coil according to the first embodiment.
Figure 7B:
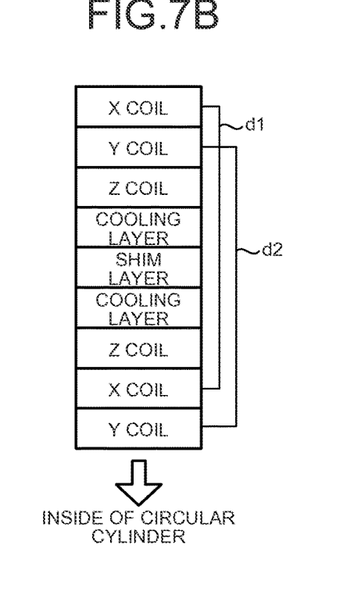

FIG. 7A and FIG. 7B are drawings illustrating the order in which the layers are laminated in the gradient coil 103 according to the first embodiment. In the first embodiment, the X coil is not laminated in the position closest to the space formed on the inside of the substantially circular cylinder, which is the space in which the subject P is placed, as illustrated in FIG. 7A, but is laminated on the outside of the Y coil that is laminated in the position closest to the space formed on the inside of the substantially circular cylinder as illustrated in FIG. 7B. Further, as illustrated in FIG. 7B, in the shield coil 103b, the coils are laminated in the order of the Z coil, the Y coil, and the X coil, starting from a position closer to the space formed on the inside of the substantially circular cylinder, in such a manner that the inter-layer distance d1 between the X coils is substantially equal to the inter-layer distance d2 between the Y coils.

As explained above, in the first embodiment, the X coil included in the main coil 103a is laminated so as to be positioned more distant from the space formed on the inside of the substantially circular cylinder, which is the space in which the subject P is placed, than the Y coil is. Further, the X coil included in the main coil 103a is laminated in a position as close as possible to the cooling pipe provided on the outside of the main coil 103a, being closer to the cooling pipe than the Y coil is. This lamination configuration may be realized by being determined at the time of the manufacture of the gradient coil 103 and being processed so that the layers are laminated in the order stated above. Alternatively, the lamination configuration may be adjusted at the time of an installment of the MRI apparatus 100 so that the layers are laminated in the order stated above.

In other words, as explained with reference to FIGS. 3 and 4, the X coil and the Y coil are each a coil processed into a saddle shape and are different from each other only in the orientations thereof with respect to the axes of the MRI apparatus 100. For this reason, if it is possible to adjust the orientation, in terms of the circumferential direction, of the gradient coil 103 at the time of an installment of the MRI apparatus 100, it is also acceptable to adjust, at this stage, the installment orientation of the gradient coil 103 in such a manner that the inner layers closer to the space formed on the inside of the substantially circular cylinder are realized with the Y coil.

As explained above, according to the first embodiment, it is possible to improve the cooling efficiency of the gradient coil. Further, by improving the cooling efficiency of the gradient coil, it is also possible to further enlarge an image taking region during the high-speed image taking process, or the like. Further, the improvement also leads to an improvement in the comfortability of patients or the like.

Figure 8:
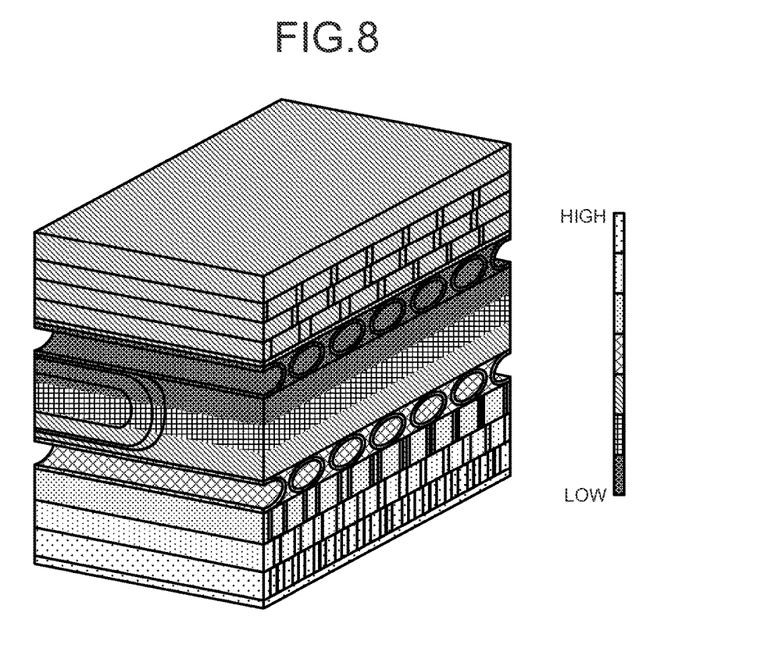
FIG. 8 is a drawing of a result of a temperature simulation according to the first embodiment.

Further, as a result of laminating the coils in the order stated above, it also becomes possible to use inexpensive and easy-to-assemble pipes made of resin (e.g., Teflon [registered trademark] tubes or the like), in contrast to conventional examples where expensive pipes made of copper or the like are used as cooling pipes. FIG. 8 is a drawing of a result of a temperature simulation according to the first embodiment. In the simulation illustrated in FIG. 8, the coils are laminated in the order explained in the first embodiment, while Teflon [registered trademark] tubes are used as the cooling pipes. In that situation, even in a thermal equilibrium state, the temperature of the space in which the subject P was placed was 40 degrees in Celsius or lower, which satisfied the IEC standard.

Other Embodiments

Possible embodiments are not limited to the embodiments described above.

In the embodiments described above, the example is explained in which the characteristics of the X coils and the Y coils are arranged to match with each other by arranging the inter-layer distance d1 between the X coils to be substantially equal to the inter-layer distance d2 between the Y coils; however, possible embodiments are not limited to this example. It is also acceptable to prioritize the cooling efficiency of the X coil included in the shield coil 103b over the arrangement to have the characteristics of the X coils and the Y coils match with each other.

Figure 9:
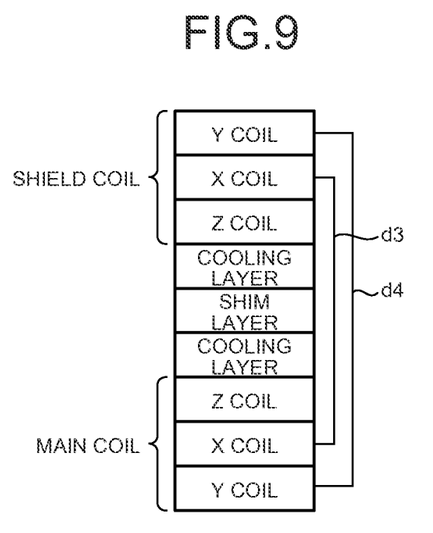
FIG. 9 is a drawing illustrating an order in which layers are laminated in a gradient coil according to another embodiment.

FIG. 9 is a drawing illustrating an order in which the layers are laminated in a gradient coil according to another embodiment. For example, as illustrated in FIG. 9, in the shield coil 103b, the coils are laminated in the order of the Z coil, the X coil, and the Y coil, starting from a position closer to the space formed on the inside of the substantially circular cylinder. In that situation, as illustrated in FIG. 9, an inter-layer distance d3 between the X coils and an inter-layer distance d4 between the Y coils is not substantially equal to each other. Thus, there is a possibility that the characteristics of the X coils may be different from those of the Y coils. In contrast, the X coil included in the shield coil 103b is also laminated in a position as close as possible to the cooling pipe disposed on the inside of the shield coil 103b, being closer to the cooling pipe than the Y coil is. It is therefore considered that the cooling efficiency of the X coil is improved compared to that in the first embodiment.

By using the magnetic resonance imaging apparatus or the gradient coil according to at least one aspect of the embodiments described above, it is possible to improve the cooling efficiency of the gradient coil.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
a static magnetic field magnet configured to generate a static magnetic field; and a composite gradient coil disposed inside the static magnetic field magnet and including a first set of coils configured to generate gradient magnetic fields, a second set of coils configured to cancel out leakage magnetic fields from the first set of coils and a cooling conduit disposed between the first set of coils and the second set of coils, the first set of coils including: (i) an X coil configured to generate a gradient magnetic field along a horizontal axis of a substantially circular cylinder, the horizontal axis being perpendicular to a long axis of the substantially circular cylinder, (ii) a Y coil configured to generate a gradient magnetic field along a vertical axis of the substantially circular cylinder, and (iii) a Z coil configured to generate a gradient magnetic field along the long axis of the substantially circular cylinder,
the second set of coils also including an X coil, a Y coil and a Z coil, wherein
in the composite gradient coil, coils are laminated, starting from a position closest to the center of the substantially circular cylinder, in an order of YXZ of the first set of coils, the cooling conduit, and ZYX of the second set of coils.

2. The magnetic resonance imaging apparatus according to claim 1, wherein no cooling pipe is disposed inside the first set of coils.

3. The magnetic resonance imaging apparatus according to claim 1, wherein, in the composite gradient coil, coils are laminated in such a manner that an inter-layer distance between the X coil included in the first set of coils and the X coil included in the second set of coils is substantially equal to an inter-layer distance between the Y coil included in the first set of coils and the Y coil included in the second set of coils.

4. The magnetic resonance imaging apparatus according to claim 1, including a magnetic resonance imaging system sequence controller configured to acquire a magnetic resonance image by performing an Echo Planar Imaging (EPI) process.

5. A composite gradient coil configured for disposition inside a static magnetic field magnet of a magnetic resonance imaging system, the composite gradient coil including a first set of coils configured to generate gradient magnetic fields, a second set of coils configured to cancel out leakage magnetic fields from the first set of coils and a cooling conduit disposed between the first set of coils and the second set of coils, the first set of coils comprising: (i) an X coil configured to generate a gradient magnetic field along a horizontal axis of a substantially circular cylinder, the horizontal axis being perpendicular to a long axis of the substantially circular cylinder, (ii) a Y coil configured to generate a gradient magnetic field along a vertical axis of the substantially circular cylinder, and (ii) a Z coil configured to generate a gradient magnetic field along the long axis of the substantially circular cylinder, the second set of coils also comprising an X coil, a Y coil and a Z coil, wherein in the composite gradient coil, coils are laminated, starting from a position closest to the center of the substantially circular cylinder, in an order of YXZ of the first set of coils, the cooling conduit, and ZYX of the second set of coils.

6. A magnetic resonance imaging apparatus comprising:

a static magnetic field magnet configured to generate a static magnetic field; and a composite gradient coil disposed inside the static magnetic field magnet and including a first set of coils configured to generate gradient magnetic fields, a second set of coils configured to cancel out leakage magnetic fields of the first set of coils and a cooling conduit disposed between the first set of coils and the second set of coils, the first set of coils including: (i) an X coil configured to generate a gradient magnetic field along a horizontal axis of a substantially circular cylinder, the horizontal axis being perpendicular to a long axis of the substantially circular cylinder, (ii) a Y coil configured to generate a gradient magnetic field along a vertical axis of the substantially circular cylinder, and (iii) a Z coil configured to generate a gradient magnetic field along the long axis of the substantially circular cylinder, the second set of coils also including an X coil, a Y coil and a Z coil, wherein in the composite gradient coil, coils are laminated, starting from a position closest to the center of the substantially circular cylinder, in an order of YXZ of the first set of coils, the cooling conduit, and the ZXY of the second set of coils.

7. A composite gradient coil configured for disposition inside a static magnetic field magnet of a magnetic resonance imaging system, the composite gradient coil including a first set of coils configured to generate gradient magnetic fields, a second set of coils configured to cancel out leakage magnetic fields of the first set of coils and a cooling conduit disposed between the first set of coils and the second set of coils, the first set of coils comprising: (i) an X coil configured to generate a gradient magnetic field along a horizontal axis of a substantially circular cylinder, the horizontal axis being perpendicular to a long axis of the substantially circular cylinder, (ii) a Y coil configured to generate a gradient magnetic field along a vertical axis of the substantially circular cylinder, and (iii) a Z coil configured to generate a gradient magnetic field along the long axis of the substantially circular cylinder, the second set of coils also comprising an X coil, a Y coil and a Z coil, wherein in the composite gradient coil, coils are laminated, starting from a position closest to the center of the substantially circular cylinder, in an order of YXZ for the first set of coils, the cooling conduit, and in an order of ZXY for the second set of coils.

* * * * *